United States Patent
Katayama

(10) Patent No.: US 6,886,733 B2
(45) Date of Patent: May 3, 2005

(54) CONDUCTIVE POWDER APPLYING DEVICE IMMERSING SUBSTRATE INTO CONDUCTIVE POWDER BY ROTATING TANK INCLUDING CONDUCTIVE POWDER AND SUBSTRATE AT OPPOSING POSITIONS

(75) Inventor: Masatoshi Katayama, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 121 days.

(21) Appl. No.: 10/390,785

(22) Filed: Mar. 19, 2003

(65) Prior Publication Data

US 2003/0209585 A1 Nov. 13, 2003

(30) Foreign Application Priority Data

May 13, 2002 (JP) .......................... 2002-137365

(51) Int. Cl.$^7$ .............................................. B23K 37/00
(52) U.S. Cl. ........................ 228/41; 228/248.1; 118/640
(58) Field of Search ................................. 228/41, 248.1; 427/96, 191; 118/640

(56) References Cited

U.S. PATENT DOCUMENTS

| | | | | |
|---|---|---|---|---|
| 3,873,350 A | * | 3/1975 | Dwyer et al. ............... | 427/378 |
| 3,877,415 A | * | 4/1975 | Blouin ........................ | 118/303 |
| 3,903,333 A | * | 9/1975 | Shirley et al. ............... | 427/212 |
| 5,328,522 A | * | 7/1994 | Sowa et al. .................... | 148/23 |
| 5,505,990 A | * | 4/1996 | Sagawa et al. .............. | 427/184 |
| 5,556,023 A | | 9/1996 | Kuramoto et al. | |
| 6,241,858 B1 | * | 6/2001 | Phillips et al. .......... | 204/192.15 |
| 6,322,685 B1 | * | 11/2001 | Kang et al. .................. | 205/143 |
| 6,355,313 B1 | * | 3/2002 | Yoshimura et al. .......... | 427/598 |
| 6,423,369 B1 | * | 7/2002 | Yoshimura et al. .......... | 427/127 |
| 6,524,381 B1 | * | 2/2003 | Phillips et al. .............. | 106/417 |
| 6,649,524 B2 | * | 11/2003 | Watanabe .................... | 438/693 |
| 2003/0003232 A1 | * | 1/2003 | Rosynsky et al. ........... | 427/294 |
| 2003/0209585 A1 | * | 11/2003 | Katayama ..................... | 228/41 |

FOREIGN PATENT DOCUMENTS

JP       363312969 A  * 12/1988

\* cited by examiner

*Primary Examiner*—Kiley S. Stoner
(74) *Attorney, Agent, or Firm*—Armstrong, Kratz, Quintos, Hanson & Brooks, LLP

(57) ABSTRACT

A conductive powder is stored at a predetermined position in a tank. At least one substrate is placed at a predetermined position opposite the conductive powder in the tank. The tank is rotated so as to immerse the substrate into the conductive powder. Thereby, the conductive powder is applied to the substrate.

16 Claims, 4 Drawing Sheets

CONDUCTIVE POWDER APPLYING DEVICE IMMERSING SUBSTRATE INTO CONDUCTIVE POWDER BY ROTATING TANK INCLUDING CONDUCTIVE POWDER AND SUBSTRATE AT OPPOSING POSITIONS

BACKGROUND OF THE INVENTION

1. Field of the Invention

The present invention generally relates to a conductive powder applying device and a conductive powder applying method, and more particularly, to a conductive powder applying device and a conductive powder applying method for applying a conductive powder to a substrate.

2. Description of the Related Art

Recently, a method named Super Juffit developed by Showa Denko K.K. has been put to practical use as a method of mounting chip components and so forth on a substrate. This Super Juffit method includes a step of forming an adhesive film on a surface of a copper circuit pattern formed on a substrate, a step of applying a solder powder, which is a conductive powder, on the adhesive film, and a step of melting the solder powder by performing a reflow process. Through these steps, a solder film is formed on the surface of the copper circuit pattern on the substrate.

The above-described Super Juffit method has an advantage of a high pattern precision appropriate for a fine pitch layout, also an advantage of an easy regulation of a thickness of the solder film by varying a particle size of the solder powder, and further, an advantage of a uniform thickness of the solder film. Thus, the Super Juffit method is a technology that enables a further integration of a semiconductor integrated circuit (LSI) and so forth.

In the above-described Super Juffit method, the solder powder needs to be applied on the adhesive film appropriately. For example, in order to make the thickness of the solder film uniform, the solder powder needs to be applied on a surface of the adhesive film with no space being left thereon. Additionally, since the solder powder tends to be wasted by dispersing in the air, the solder powder needs to be used efficiently. Further, the solder powder needs to be prevented from damaging the substrate.

SUMMARY OF THE INVENTION

It is a general object of the present invention to provide an improved and useful conductive powder applying device and a conductive powder applying method in which the above-mentioned problems are eliminated.

A more specific object of the present invention is to provide a conductive powder applying device and a conductive powder applying method which can appropriately apply a conductive powder to a substrate.

In order to achieve the above-mentioned objects, there is provided according to one aspect of the present invention a conductive powder applying device applying a conductive powder to a substrate, the device including a tank including the conductive powder stored at a predetermined position in the tank, and the substrate placed at a predetermined position opposite the conductive powder in the tank, and a rotating mechanism rotating the tank so as to immerse the substrate into the conductive powder.

According to the present invention, the conductive powder can be applied to the substrate with no unnecessary space being left thereon.

Additionally, in the conductive powder applying device according to the present invention, the tank may comprise an entrance opening adjacent to the predetermined position at which the substrate is placed so that the conductive powder and the substrate are put into the tank through the entrance opening.

According to the present invention, before the tank is rotated, the conductive powder is positioned away from the entrance opening. Therefore, the conductive powder is prevented from dispersing in the course of placing the substrate into the tank; thus, the conductive powder can be used efficiently.

Additionally, the conductive powder applying device according to the present invention may further comprise a vibrating mechanism vibrating the tank after the substrate is immersed into the conductive powder.

According to the present invention, the tank is vibrated so as to make spaces among particles in the conductive powder small. Therefore, the conductive powder can be applied more closely to the substrate with no unnecessary space being left thereon.

Additionally, in the conductive powder applying device according to the present invention, a rotary axis of the tank may be substantially in parallel with a direction of a thickness of the substrate.

According to the present invention, upon rotating the tank, the conductive powder can flow in a direction substantially parallel with a surface of the substrate. Therefore, a damage inflicted on the substrate can be reduced, compared with a case where the conductive powder collides perpendicularly with the surface of the substrate.

Additionally, in the conductive powder applying device according to the present invention, the tank may include a plurality of the substrates placed in parallel at the predetermined position opposite the conductive powder in the tank.

According to the present invention, with the rotary axis of the tank being substantially in parallel with the direction of the thickness of each of the substrates, the conductive powder easily flows into gaps among the substrates so that each of the substrates can be immersed evenly in the conductive powder.

Other objects, features and advantages of the present invention will become more apparent from the following detailed description when read in conjunction with the accompanying drawings.

DETAILED DESCRIPTION OF THE PREFERRED EMBODIMENTS

A description will now be given, with reference to the drawings, of embodiments according to the present invention.

In the present invention, a conductive powder, such as a solder powder, is stored at a predetermined position inside a tank. At least one substrate is placed at a position opposite the conductive powder inside the tank. The tank is rotated so as to immerse the substrate into the conductive powder. Thereby, the conductive powder is applied to the substrate.

Figure 1:
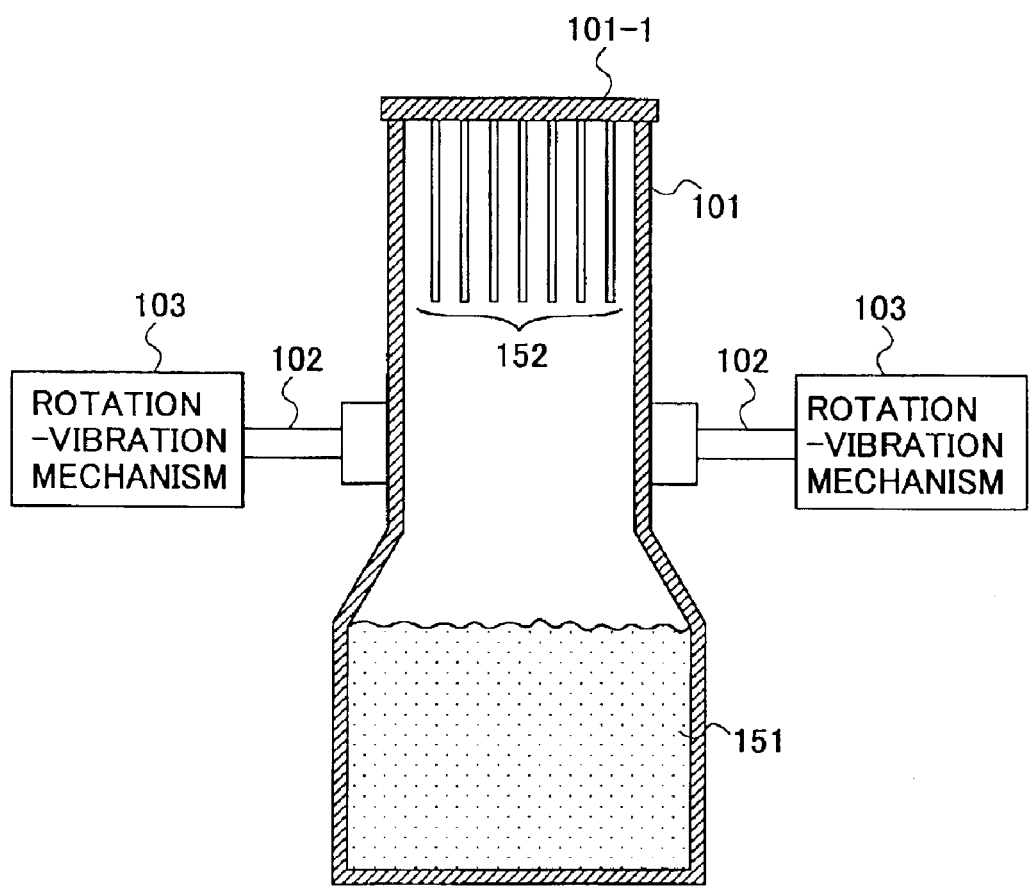
FIG. 1 is a side view of a conductive powder applying device according to an embodiment of the present invention.

FIG. 1 is a side view of a conductive powder applying device according to an embodiment of the present invention. The conductive powder applying device shown in FIG. 1 comprises a tank 101, a rotary shaft 102 and a rotation-vibration mechanism 103.

In the tank 101, a solder powder 151, which is a conductive powder, is stored at a lower part therein, and a plurality of substrates 152 are placed at an upper part therein.

A lid 101-1 is provided on the upper part of the tank 101. When the solder powder 151 is put into the tank 101 beforehand, the lid 101-1 is opened. Additionally, each time a process of applying the solder powder 151 to the substrates 152 is performed, the lid 101-1 is opened so that the substrates 152 are put into and out of the tank 101. In the course of putting the substrates 152 into and out of the tank 101, the solder powder 151 is stored at the lower part in the tank 101, away from the lid 101-1. Therefore, even when the lid 101-1 is opened, the solder powder 151 is prevented from dispersing out of the tank 101. The substrates 152 are mounted in parallel on an under surface of the lid 101-1, i.e., on an inner surface of the tank 101.

Figure 2:
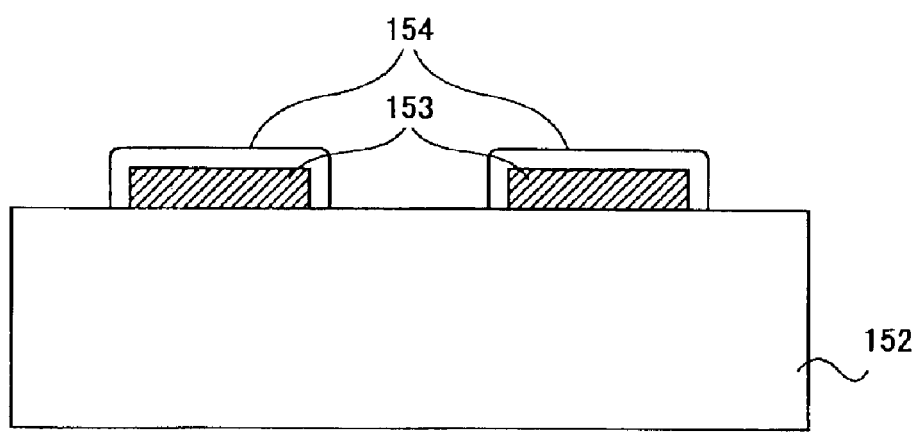
FIG. 2 is a side view of a substrate placed in a tank shown in FIG. 1.

FIG. 2 is a side view of the substrate 152 placed in the tank 101. As shown in FIG. 2, a copper circuit pattern 153 is formed at a surface of the substrate 152. Additionally, an adhesive film 154 on which the solder powder 151 is to be applied is formed on a surface of the copper circuit pattern 153.

The adhesive film 154 is formed as follows. First, the surface of the substrate 152 is etched so as to expose the copper circuit pattern 153. Next, the substrate 152 is dipped in a predetermined agent used for forming an adhesive film. In this course, the adhesive film 154 is formed only on the surface of the copper circuit pattern 153 due to a chemical reaction caused by the agent.

In FIG. 1, the rotary shaft 102 is mounted at a substantially central part of the tank 101. The rotary shaft 102 extends substantially in parallel with a direction of a thickness of each of the substrates 152. The rotation-vibration mechanism 103 comprises a drive motor (not shown in the figure), for example, and drives the rotary shaft 102 so as to rotate the tank 101 substantially 180 degrees.

Figure 3:
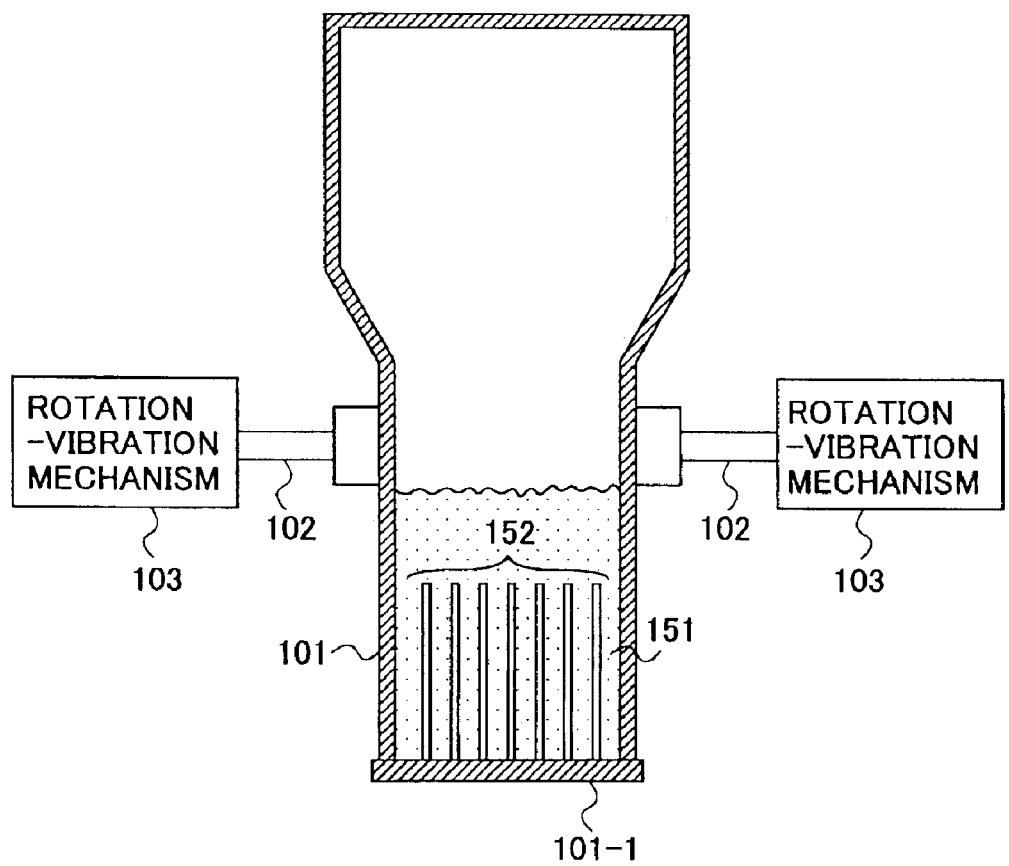
FIG. 3 is a side view of the conductive powder applying device in a state after the tank is rotated.

FIG. 3 is a side view of the conductive powder applying device in a state after the tank 101 is rotated substantially 180 degrees. When the rotation-vibration mechanism 103 rotates the tank 101, the solder powder 151 flows toward the substrates 152. Then, when the tank 101 is rotated substantially 180 degrees, the substrates 152 are immersed in the solder powder 151.

As mentioned above, the rotary shaft 102 extends substantially in parallel with the direction of the thickness of each of the substrates 152. Accordingly, when the tank 101 is rotated, the solder powder 151 flows in a direction substantially parallel with the surface of each of the substrates 152. Therefore, the solder powder 151 is prevented from colliding perpendicularly with the surface of the substrate 152; this reduces a damage to be inflicted on the substrate 152.

Additionally, since the solder powder 151 flows in the direction substantially parallel with the surface of each of the substrates 152 upon the rotation of the tank 101, the solder powder 151 easily flows into gaps among the substrates 152 so that each of the substrates 152 is immersed evenly in the solder powder 151.

After rotating the tank 101 so as to immerse the substrates 152 in the solder powder 151, the rotation-vibration mechanism 103 vibrates the tank 101 via the rotary shaft 102. In the solder powder 151 caused to flow by the rotation of the tank 101, an inter-particle space is made large. Thereupon, by vibrating the tank 101, the inter-particle space in the solder powder 151 is made small so as to facilitate the application of the solder powder 151 to the substrates 152.

Figure 4:
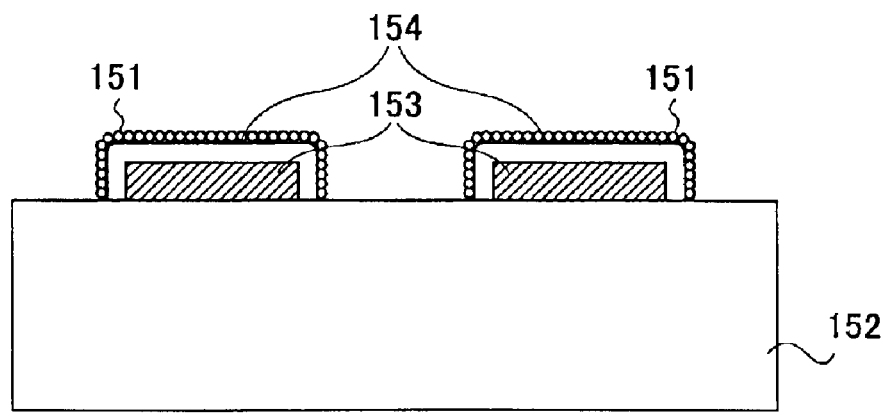
FIG. 4 is a side view of the substrate to which a solder powder is applied.

The solder powder 151 is applied to each of the substrates 152 by the above-described process. FIG. 4 is a side view of the substrate 152 to which the solder powder 151 is applied. As shown in FIG. 4, the solder powder 151 is applied uniformly, particle by particle, on a surface of the adhesive film 154 formed on the copper circuit pattern 153 on the substrate 152.

After the solder powder 151 is applied to each of the substrates 152, the rotation-vibration mechanism 103 rotates the tank 101 substantially 180 degrees again so as to cause the tank 101 to bear an original posture as shown in FIG. 1.

Figure 5:
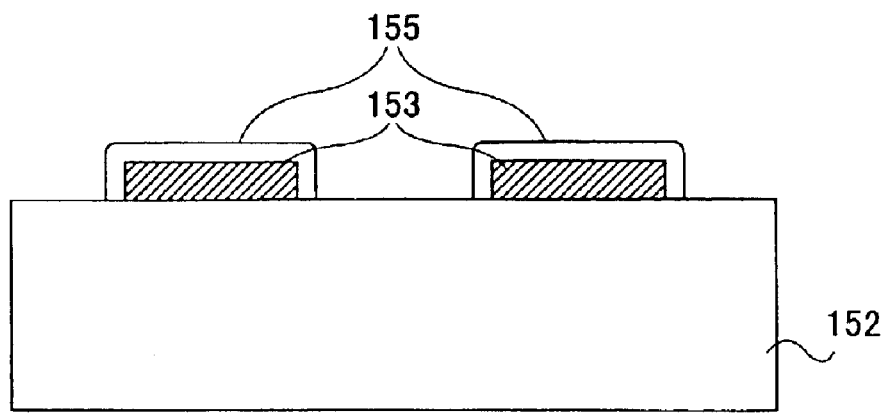
FIG. 5 is a side view of the substrate after a reflow process.

Each of the substrates 152 to which the solder powder 151 is applied is retrieved from the tank 101, and is subjected to a reflow process. FIG. 5 is a side view of the substrate 152 after the reflow process. As shown in FIG. 5, by the reflow process, the adhesive film 154 formed on the copper circuit pattern 153 on the substrate 152 flows out; additionally, the solder powder 151 is melted so as to become a solder film 155 uniform in thickness so as to be applied on the copper circuit pattern 153.

As described above, in the conductive powder applying device according to the present embodiment, the solder powder 151 is stored at the lower part in the tank 101, and the substrates 152 are placed at the upper part in the tank 101; then, the tank 101 is rotated so as to cause the solder powder 151 to flow, whereby the substrates 152 are immersed in the solder powder 151. Accordingly, the solder powder 151 can be applied to each of the substrates 152 with no space being left on the surface of the adhesive film 154.

In the above-described embodiment, the rotation-vibration mechanism 103 corresponds to a rotating mechanism and a vibrating mechanism, and the lid 101-1 of the tank 101 corresponds to an entrance opening.

Besides, in the above-described embodiment, the conductive powder is applied to a plurality of the substrates simultaneously; however, the present invention is applicable to a case where the conductive powder is applied to each of the substrates one by one.

Further, in the above-described embodiment, the solder powder is used as the conductive powder; however, the present invention is applicable to a case where other conductive powders are used.

The present invention is not limited to the specifically disclosed embodiments, and variations and modifications may be made without departing from the scope of the present invention.

The present application is based on Japanese priority application No. 2002-137365 filed on May 13, 2002, the entire contents of which are hereby incorporated by reference.

What is claimed is:

1. A conductive powder applying device applying a conductive powder to a substrate, the device comprising:

a tank including said conductive powder stored at a predetermined position in the tank, and said substrate placed at a predetermined position opposite said conductive powder in the tank; and a rotating mechanism rotating said tank so as to immerse said substrate into said conductive powder.

2. The conductive powder applying device as claimed in claim 1, wherein said tank comprises an entrance opening adjacent to said predetermined position at which said substrate is placed so that said conductive powder and said substrate are put into said tank through said entrance opening.

3. The conductive powder applying device as claimed in claim 1, further comprising a vibrating mechanism vibrating said tank after said substrate is immersed into said conductive powder.

4. The conductive powder applying device as claimed in claim 2, further comprising a vibrating mechanism vibrating said tank after said substrate is immersed into said conductive powder.

5. The conductive powder applying device as claimed in claim 1, wherein said tank includes a plurality of the substrates placed at the predetermined position opposite said conductive powder in the tank.

6. The conductive powder applying device as claimed in claim 2, wherein said tank includes a plurality of the substrates placed at the predetermined position opposite said conductive powder in the tank.

7. The conductive powder applying device as claimed in claim 3, wherein said tank includes a plurality of the substrates placed at the predetermined position opposite said conductive powder in the tank.

8. The conductive powder applying device as claimed in claim 4, wherein said tank includes a plurality of the substrates placed at the predetermined position opposite said conductive powder in the tank.

9. The conductive powder applying device as claimed in claim 1, wherein a rotary axis of said tank is substantially in parallel with a direction of a thickness of said substrate.

10. The conductive powder applying device as claimed in claim 2, wherein a rotary axis of said tank is substantially in parallel with a direction of a thickness of said substrate.

11. The conductive powder applying device as claimed in claim 3, wherein a rotary axis of said tank is substantially in parallel with a direction of a thickness of said substrate.

12. The conductive powder applying device as claimed in claim 4, wherein a rotary axis of said tank is substantially in parallel with a direction of a thickness of said substrate.

13. The conductive powder applying device as claimed in claim 5, wherein a rotary axis of said tank is substantially in parallel with a direction of a thickness of each of said substrates.

14. The conductive powder applying device as claimed in claim 6, wherein a rotary axis of said tank is substantially in parallel with a direction of a thickness of each of said substrates.

15. The conductive powder applying device as claimed in claim 7, wherein a rotary axis of said tank is substantially in parallel with a direction of a thickness of each of said substrates.

16. The conductive powder applying device as claimed in claim 8, wherein a rotary axis of said tank is substantially in parallel with a direction of a thickness of each of said substrates.

* * * * *